(12) United States Patent
Zhang et al.

(10) Patent No.: US 11,381,251 B2
(45) Date of Patent: Jul. 5, 2022

(54) DATA PROCESSING SYSTEM AND METHOD

(71) Applicants: Siemens Aktiengesellschaft, Munich (DE); SIEMENS LTD., Beijing (CN)

(72) Inventors: Peng Zhang, Beijing (CN); Bo Wen, Beijing (CN); Shun Jie Fan, Beijing (CN)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 17/432,971

(22) PCT Filed: Apr. 23, 2019

(86) PCT No.: PCT/CN2019/083874
§ 371 (c)(1),
(2) Date: Aug. 23, 2021

(87) PCT Pub. No.: WO2020/215203
PCT Pub. Date: Oct. 29, 2020

(65) Prior Publication Data
US 2022/0103184 A1    Mar. 31, 2022

(51) Int. Cl.
*H03M 7/30* (2006.01)

(52) U.S. Cl.
CPC ....... *H03M 7/6041* (2013.01); *H03M 7/3064* (2013.01)

(58) Field of Classification Search
CPC .... H03M 7/6041; H03M 7/3064; H03M 7/30; H04N 19/12; H04N 19/15; H04N 19/124
(Continued)

(56) References Cited

U.S. PATENT DOCUMENTS

| | | | | |
|---|---|---|---|---|
| 11,018,692 B2* | 5/2021 | Nag | ...................... | H03M 7/3059 |
| 2015/0095524 A1* | 4/2015 | Han | ........................ | G06F 13/32 |
| | | | | 710/47 |

(Continued)

FOREIGN PATENT DOCUMENTS

| | | |
|---|---|---|
| CN | 102664635 A | 9/2012 |
| CN | 105117504 A | 12/2015 |
| EP | 2698679 A1 | 2/2014 |

OTHER PUBLICATIONS

International Search Report and Written Opinion dated Jan. 21, 2020.

(Continued)

*Primary Examiner* — Lam T Mai
(74) *Attorney, Agent, or Firm* — Harness, Dickey & Pierce, P.L.C.

(57) ABSTRACT

A data processing system and method are provided. The data processing system includes: a data acquisition unit, configured to acquire a plurality pieces of data related to a target object; and a data processing unit, configured to receive the plurality pieces of data and set a plurality of adjacent regions in a two-dimensional spatial representation of the plurality pieces of data according to a tolerable compression error. The plurality of regions include an adjacent first region and second region, respectively covering a plurality pieces of data. The data processing unit is configured to forwardly expand the second region to obtain the expanded second region overlapping the first region, calculate a compression error of data covered by the expanded second region, reset the first region and compress the data covered by the reset first region. The data processing system can reduce or minimize the data compression error.

22 Claims, 4 Drawing Sheets

(58) Field of Classification Search
USPC .................................................. 341/50–95
See application file for complete search history.

(56) References Cited

U.S. PATENT DOCUMENTS

| | | | |
|---|---|---|---|
| 2015/0254194 A1* | 9/2015 | Han | G06F 13/34 |
| | | | 710/47 |
| 2016/0048952 A1* | 2/2016 | Tezaur | G06T 5/004 |
| | | | 382/255 |
| 2020/0293885 A1* | 9/2020 | Yoshinaga | H03M 7/46 |
| 2020/0358455 A1* | 11/2020 | Nag | H03M 7/3071 |
| 2021/0021282 A1* | 1/2021 | Sample | H03M 7/6041 |
| 2021/0168711 A1* | 6/2021 | Zhang | H04W 52/0216 |
| 2021/0337218 A1* | 10/2021 | Bergland | H03M 7/3059 |
| 2022/0029901 A1* | 1/2022 | Varnavas | H04L 43/0817 |

OTHER PUBLICATIONS

International Search Report and Written Opinion with English translation dated Jan. 21, 2020.

\* cited by examiner

DATA PROCESSING SYSTEM AND METHOD

PRIORITY STATEMENT

This application is the national phase under 35 U.S.C. § 371 of PCT International Application No. PCT/CN2019/083874 which has an International filing date of Apr. 23, 2019, the entire contents of which are hereby incorporated herein by reference.

FIELD

Embodiments of the present application generally relate to a data processing system and method.

BACKGROUND

In application such as Industry 4.0 and the Internet of Things (IOT), machine equipment might generate large amounts of data in the course of real-time operation. Thus, in order to reduce the size of this data so that it can be transmitted more conveniently and quickly, compression thereof is often considered. The Swing Door Trending (Swing Door Trend, SDT) algorithm is an available algorithm for data compression. The SDT algorithm has high execution efficiency, and has therefore been applied widely in the course of transmission and processing of large amounts of data of this type.

SUMMARY

At least one embodiment of the present invention seeks to improve upon and/or solve at least one of the abovementioned and/or other technical problems and provide a data processing system and/or method capable of reducing or minimizing compression errors.

In an example embodiment, a data processing system is provided, the data processing system comprising: a data acquisition unit, configured to acquire multiple items of data relating to a target object; and a data processing unit, configured to receive the multiple items of data, and set multiple mutually adjacent regions in a two-dimensional spatial representation of the multiple items of data according to a permissible compression error value, wherein the multiple regions comprise a first region and a second region which are adjacent to each other and separately cover multiple items of data, wherein the data processing unit is further configured to expand the second region forward in order to obtain an expanded second region overlapping the first region, calculate a compression error of the data covered by the expanded second region, reset the first region according to the calculated compression error, and compress the data covered by the reset first region.

In another example embodiment, a data processing method may comprise: setting multiple mutually adjacent regions in a two-dimensional spatial representation of multiple items of data to be compressed, according to a permissible compression error value, wherein the multiple regions comprise a first region and a second region which are adjacent to each other and separately cover multiple items of data; expanding the second region forward in order to obtain an expanded second region overlapping the first region, calculating a compression error of the data covered by the expanded second region, and resetting the first region according to the calculated compression error; compressing the data covered by the reset first region. Here, the step of setting multiple regions, the step of calculating a compression error and the step of performing compression may be performed according to a rule of a Swing Door Trending (SDT) algorithm.

In another example embodiment, an electronic device may comprise: at least one processor; and a memory connected to the at least one processor, the memory having an instruction stored therein, wherein the instruction, when executed by the at least one processor, causes the electronic device to perform an embodiment of the method.

In another example embodiment, a non-transitory machine readable medium may have stored thereon a computer executable instruction which, when executed, causes at least one processor to perform an embodiment of the method.

In another example embodiment, a computer program may comprise a computer executable instruction which, when executed, causes at least one processor to perform an embodiment of the method.

BRIEF DESCRIPTION OF THE DRAWINGS

The following drawings are merely intended to illustrate and explain the present invention schematically, without limiting the scope thereof. In the drawings.

KEY TO REFERENCE LABELS

Figure 1:
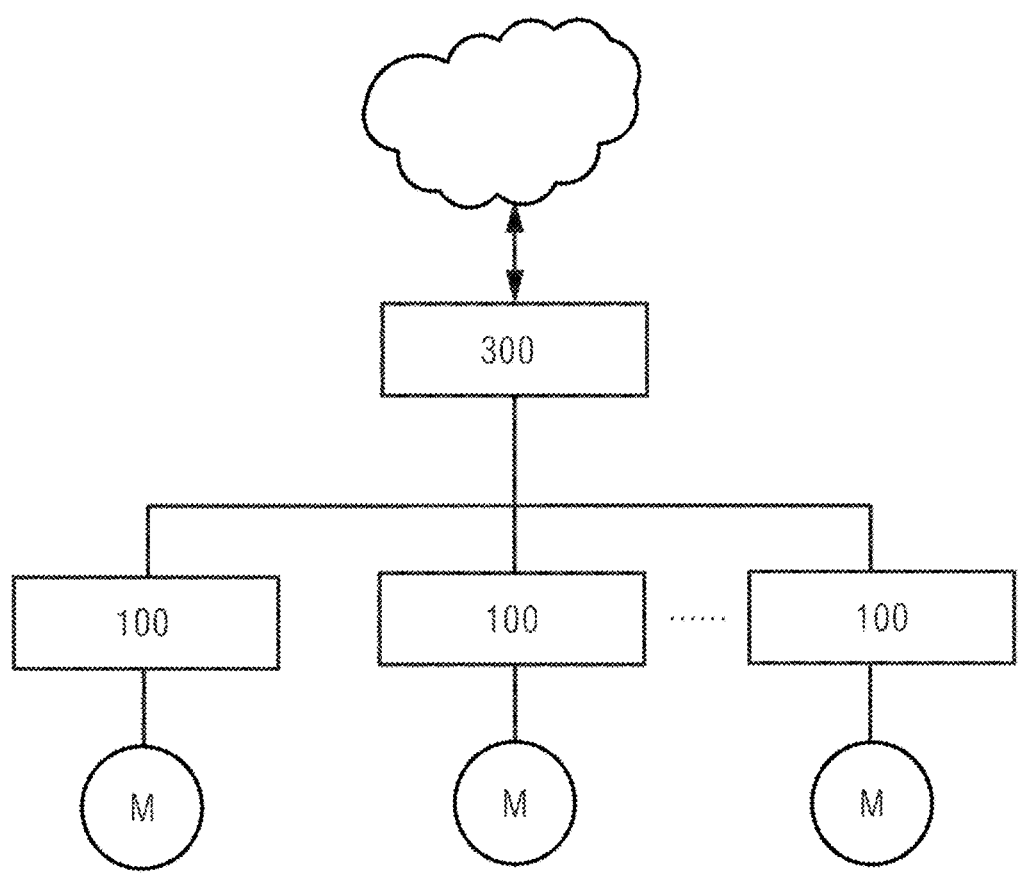
FIG. 1 is a schematic block diagram showing a data processing system according to an example embodiment.

100: data acquisition unit; M: target object; 300: data processing unit 610: processor; 630: memory.

DETAILED DESCRIPTION OF THE INVENTION

In an example embodiment, a data processing system is provided, the data processing system comprising: a data acquisition unit, configured to acquire multiple items of data relating to a target object; and a data processing unit, configured to receive the multiple items of data, and set multiple mutually adjacent regions in a two-dimensional spatial representation of the multiple items of data according to a permissible compression error value, wherein the multiple regions comprise a first region and a second region which are adjacent to each other and separately cover multiple items of data, wherein the data processing unit is further configured to expand the second region forward in order to obtain an expanded second region overlapping the first region, calculate a compression error of the data covered by the expanded second region, reset the first region according to the calculated compression error, and compress the data covered by the reset first region.

The data processing unit is configured to set multiple regions, calculate a compression error and perform compression according to a rule of a Swing Door Trending (SDT) algorithm.

The data processing unit is configured to use the data covered by an overlap region, in which the first region and the expanded second region overlap each other, as an end boundary of the reset first region.

The multiple items of data comprise data y1, y2, ..., yn−1, yn, yn+1, ..., yn+m, ..., arranged in sequence in the two-dimensional spatial representation, wherein n and m are integers greater than 2, the data processing unit is configured to set the first region so as to have the data y1 and data yn as boundaries and cover the data y1, y2, ..., yn−1, yn, and the data processing unit is configured to set the second region so as to have the data yn and data yn+m as boundaries and cover the data yn, yn+1, ..., yn+m−1, yn+m, wherein the data processing unit is configured to expand the second region in the two-dimensional spatial representation in a direction opposite to a direction of data arrangement so as to overlap the first region, and thereby obtain an expanded second region that covers the data yi, yi+1, ..., yn−1 covered by a region of overlap, wherein i is an integer with $1<i\leq n-1$, and the data yn, yn+1, ..., yn+m−1, yn+m covered by the second region.

The data processing unit is configured to: calculate a compression error $CE1\_i$ of the data y1, y2, ..., yi covered by a reduced first region with the data y1 and data yi as boundaries, and a compression error $CEi\_n+m$ of the data yi, yi+1, ..., yn−1, yn, yn+1, ..., yn+m−1, yn+m covered by the expanded second region with the data yi and data yn+m as boundaries, and determine whether the compression error $CE1\_i$ is less than or equal to a compression error CE1 of the first region, and whether the compression error $CEi\_n+m$ is less than or equal to a compression error CE2 of the second region, wherein the data processing unit is configured to use as the reset first region the reduced first region having the data y1 and data yi as boundaries and covering the data y1, y2, ..., yi, when it is determined that the compression error $CE1\_i$ is less than or equal to the compression error CE1 of the first region and the compression error $CEi\_n+m$ is less than or equal to the compression error CE2 of the second region.

The data processing unit is configured to: calculate a compression error $CE1\_i+j$ of the data y1, y2, ..., yi+j covered by the reduced first region with the data y1 and data yi+j as boundaries and a compression error $CEi+j\_n+m$ of the data yi+j, ..., yn−1, yn, yn+1, ..., yn+m−1, yn+m covered by the expanded second region with the data yi+j and data yn+m as boundaries, when it is determined that a compression error $CE1\_i+j-1$ is greater than the compression error CE1 of the first region or a compression error $CEi+j-1\_n+m$ is greater than the compression error CE2 of the second region, wherein j is an integer with $1\leq j<n-i$, wherein the data processing unit is configured to use as the reset first region the reduced first region with the data y1 and data yi+j as boundaries, when it is determined that the compression error $CE1\_i+j$ is less than or equal to the compression error CE1 of the first region and the compression error $CEi+j\_n+m$ is less than or equal to the compression error CE2 of the second region.

The data processing unit is configured to set the multiple regions to comprise an Nth region and an (N+1)th region, wherein the Nth region and an (N−1)th region are adjacent to each other and cover multiple items of data, and the (N+1)th region and Nth region are adjacent to each other and cover multiple items of data, wherein N is an integer with $N>1$, wherein the data processing unit is configured to: when the (N−1)th region is reset, expand the Nth region forward to form an expanded Nth region having as a starting boundary the data serving as an end boundary of the reset (N−1)th region; expand the (N+1)th region forward to obtain an expanded (N+1)th region overlapping the expanded Nth region, calculate a compression error of the data covered by the expanded (N+1)th region, and reset the expanded Nth region according to the calculated compression error; and compress the reset expanded Nth region.

In another example embodiment, a data processing method may comprise: setting multiple mutually adjacent regions in a two-dimensional spatial representation of multiple items of data to be compressed, according to a permissible compression error value, wherein the multiple regions comprise a first region and a second region which are adjacent to each other and separately cover multiple items of data; expanding the second region forward in order to obtain an expanded second region overlapping the first region, calculating a compression error of the data covered by the expanded second region, and resetting the first region according to the calculated compression error; compressing the data covered by the reset first region. Here, the step of setting multiple regions, the step of calculating a compression error and the step of performing compression may be performed according to a rule of a Swing Door Trending (SDT) algorithm.

The step of resetting the first region comprises: using the data covered by an overlap region, in which the first region and the expanded second region overlap each other, as an end boundary of the reset first region.

The multiple items of data comprise data y1, y2, ..., yn−1, yn, yn+1, ..., yn+m, ..., arranged in sequence in the two-dimensional spatial representation, wherein n and m are integers greater than 2, the first region has the data y1 and data yn as boundaries and covers the data y1, y2, ..., yn−1, yn, the second region has the data y1 and data yn+m as boundaries and covers the data yn, yn+1, ..., yn+m−1, yn+m, and the step of expanding the second region forward comprises: expanding the second region in the two-dimensional spatial representation in a direction opposite to a direction of data arrangement so as to overlap the first region, and thereby obtaining an expanded second region that covers the data yi, yi+1, ..., yn−1 covered by a region of overlap, wherein i is an integer with $1<i\leq n-1$, and the data yn, yn+1, ..., yn+m−1, yn+m covered by the second region.

The step of calculating a compression error of the data covered by the expanded second region comprises: calculating a compression error $CE1\_i$ of the data y1, y2, ..., yi covered by a reduced first region with the data y1 and data yi as boundaries, and a compression error $CEi\_n+m$ of the data yi, yi+1, ..., yn−1, yn, yn+1, ..., yn+m−1, yn+m covered by the expanded second region with the data yi and data yn+m as boundaries, and determining whether the compression error $CE1\_i$ is less than or equal to a compression error CE1 of the first region, and whether the compression error $CEi\_n+m$ is less than or equal to a compression error CE2 of the second region, The step of resetting the first region according to the calculated compression error comprises: using as the reset first region the reduced first region having the data y1 and data yi as boundaries and covering the data y1, y2, ..., yi, when it is determined that the compression error $CE1\_i$ is less than or equal to the compression error CE1 of the first region and the compression error $CEi\_n+m$ is less than or equal to the compression error CE2 of the second region.

The step of calculating a compression error corresponding to the expanded second region comprises: calculating a compression error $CE1\_i+j$ of the data y1, y2, ..., yi+j covered by the reduced first region with the data y1 and data yi+j as boundaries and a compression error $CE_{i+j\_n+m}$ of the data yi+j, yn−1, yn, yn+1, ..., yn+m−1, yn+m covered by the expanded second region with the data yi+j and data yn+m as boundaries, when it is determined that a compression error $CE1\_i+j-1$ is greater than the compression error CE1 of the first region or a compression error $CE_{i+j-1\_n+m}$ is greater than the compression error CE2 of the second region, wherein j is an integer with 1≤j<n−i, and the step of resetting the first region according to the calculated compression error comprises: using as the reset first region the reduced first region with the data y1 and data yi+j as boundaries, when it is determined that the compression error $CE1\_i+j$ is less than or equal to the compression error CE1 of the first region and the compression error $CE_{i+j\_n+m}$ is less than or equal to the compression error CE2 of the second region.

The multiple regions comprise an Nth region and an (N+1)th region, wherein the Nth region and an (N−1)th region are adjacent to each other and cover multiple items of data, and the (N+1)th region and Nth region are adjacent to each other and cover multiple items of data, wherein N is an integer with N>1, the method further comprising: when the (N−1)th region is reset, expanding the Nth region forward to form an expanded Nth region having as a starting boundary the data serving as an end boundary of the reset (N−1)th region; expanding the (N+1)th region forward to obtain an expanded (N+1)th region overlapping the expanded Nth region, calculating a compression error of the data covered by the expanded (N+1)th region, and resetting the expanded Nth region according to the calculated compression error; and compressing the reset expanded Nth region.

In another example embodiment, an electronic device may comprise: at least one processor; and a memory connected to the at least one processor, the memory having an instruction stored therein, wherein the instruction, when executed by the at least one processor, causes the electronic device to perform an embodiment of the method.

In another example embodiment, a non-transitory machine readable medium may have stored thereon a computer executable instruction which, when executed, causes at least one processor to perform an embodiment of the method.

In another example embodiment, a computer program may comprise a computer executable instruction which, when executed, causes at least one processor to perform an embodiment of the method.

In order to achieve a clearer understanding of the technical features, objectives and effects of the present invention, particular embodiments of the present invention are now explained with reference to the drawings.

FIG. 1 is a schematic block diagram showing a data processing system according to an example embodiment. As shown in FIG. 1, the data processing system according to an example embodiment may comprise data acquisition units 100 and a data processing unit 300. The data processing system can acquire data of target objects M via the data acquisition units 100. When the processing system according to an example embodiment is used in the Internet of Things (IOT), the target object M can be an electric machine. The data acquisition unit 100 may be implemented as a driver, which drives the electric machine to operate and can acquire data relating to electric machine operation and configuration.

The data processing unit 300 can receive data relating to the target object from the data acquisition unit 100, and can subject the data to processing, e.g. compression. The processed (for example, compressed) data can then be sent to the outside, e.g. a cloud. Here, when the target object M is an electric machine in an IOT application, the data processing unit 300 may be realized as an edge device of an industrial gateway, etc. of a product such as Siemens Mind-Connect IOT2040 or Mind-Connect Nano, and can send the processed data to a cloud such as Siemens MindSphere.

Figure 2:
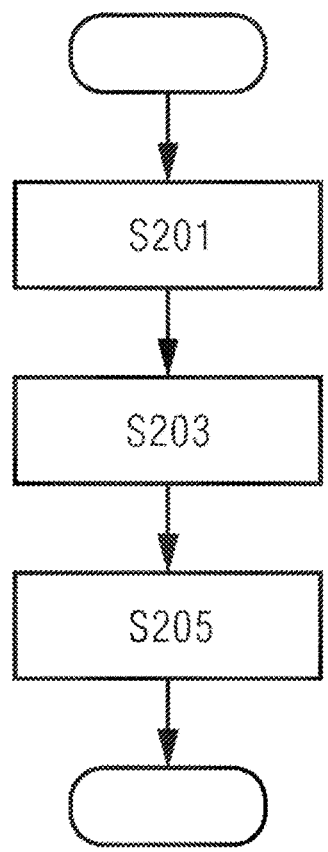
FIG. 2 is a flow chart showing a data processing method according to an example embodiment.

The amount of data coming from the data acquisition units 100 could be very large, so the data processing unit 300 can subject the data to processing, e.g. compression, before sending the data to the outside, in order to reduce the amount of data to be sent. For example, FIG. 2 is a flow chart showing a data processing method according to an example embodiment. The data processing unit 300 can perform the data processing method according to an example embodiment as shown in FIG. 2. Thus, the processing (compression) operation performed on the data by the data processing unit 300 according to an example embodiment is described in detail below with reference to FIG. 2.

As stated above, for example in an IOT application, the data may be real-time data relating to the operation and configuration of machine equipment such as an electric machine. Such data may generally comprise time information, and information indicating an operating state of the machine equipment at a time point indicated by the time information. Thus, such data can be represented in a coordinate system in which the two dimensions are time and a sensed value of the machine equipment's operating state. However, example embodiments are not limited to this, and those skilled in the art will understand that the data processing method according to an example embodiment could be applied to any data capable of being represented in two-dimensional (2D) space. It is possible to selectively define the two different dimensions on which the representation in 2D space is based, e.g. time and the sensed value of the machine equipment's operating state as described in the present embodiment, or any other desired definition of dimensions for 2D spatial representation.

As shown in FIG. 2, in step S201, the data processing unit 300 can set multiple mutually adjacent regions in a 2D spatial representation of multiple items of data according to certain permissible compression error values ΔE. To this end, a representation of multiple items of data in 2D space based on predefined dimensions can be obtained according to predefined dimensions. Multiple regions can then be set in the 2D space according to predetermined or selected permissible compression error values ΔE. In one example embodiment, the data processing unit 300 can use the rules of an SDT algorithm to set multiple parallelogram-shaped regions in the 2D spatial representation of these data. Here, the permissible compression error values ΔE used to set each parallelogram-shaped region can be different from each other.

Figure 3:
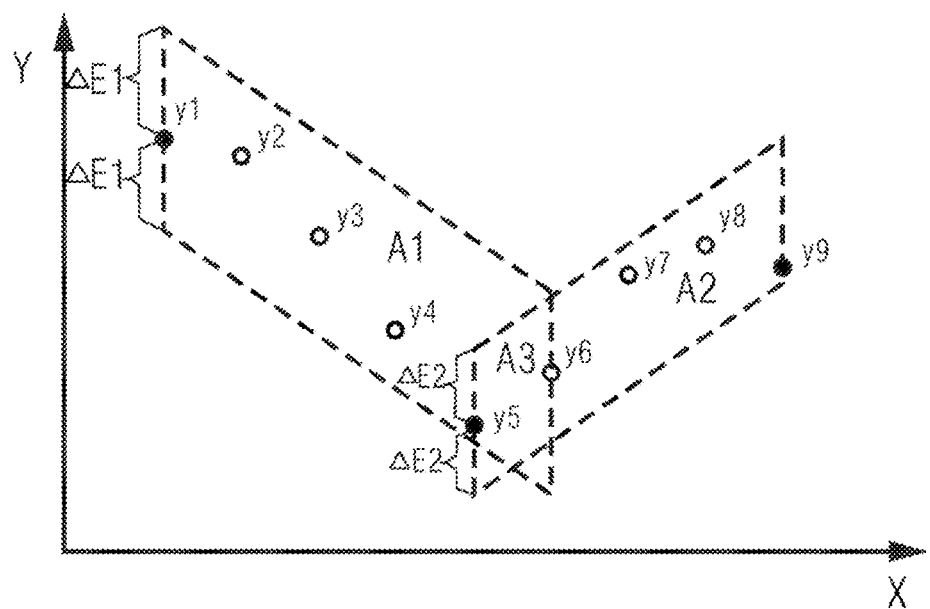
FIG. 3 is a schematic diagram showing regions according to an example embodiment.

FIG. 3 is a schematic diagram showing the setting of regions in a 2D spatial representation of multiple items of data according to an example embodiment. FIG. 3 shows schematically data y1, y2, y3, y4, y5, y6, y7, y8 and y9 represented in 2D space defined with time (X axis) and a sensed value (Y axis) of a particular operating state of machine equipment at that time as two dimensions of a coordinate system. The data processing unit 300 can preset a permissible compression error value ΔE1, and can use the rules of the SDT algorithm to set a first region (parallelogram) A1 according to the permissible compression error value ΔE1. For example, the rules of the SDT algorithm can be used to set the first region A1, wherein the first region A1 can have the data y1 and y6 as a starting boundary (starting point) and an end boundary (end point), and can cover the data y1, y2, y3, y4, y5 and y6.

The data processing unit 300 can then preset a permissible compression error value ΔE2, and can use the rules of the SDT algorithm to set a second region (parallelogram) A2 according to the permissible compression error value ΔE2. For example, the rules of the SDT algorithm can be used to set the second region A2, wherein the second region (parallelogram) A2 can cover the data y6, y7, y8 and y9, and can have the data y6 as a starting boundary (starting point) and the data y9 as an end boundary (end point). In addition, although the permissible compression error value ΔE2 is shown as being smaller than the permissible compression error value ΔE1 in FIG. 3, according to an example embodiment the permissible compression error value ΔE2 can be equal to or greater than the permissible compression error value ΔE1.

At this time, according to the rules of the SDT algorithm, the data processing unit 300 may only store and/or only send to the outside the data y1, y6 and y9 serving as the boundaries, and can thereby achieve compression of the data y1, . . . , y9. However, as will be described in detail below, in an example embodiment, before compressing the data y1, . . . , y9, a compression error will be additionally taken into account, and the regions will be reset according to the compression error, so as to minimize the compression error when performing compression according to the reset regions.

Specifically, as shown in FIG. 2, in step S203, the data processing unit 300 can expand the second region forward to obtain an expanded second region overlapping the first region; the data processing unit 300 can then calculate a compression error of data covered by the expanded second region, and can reset the first region according to the calculated compression error.

In an example embodiment of the present invention, forward expansion means: without changing the end boundary of the region, moving the starting boundary of the region in a parallel fashion in a direction (forward direction) opposite to a direction of data arrangement (backward direction) until the starting boundary intersects with data lying in the forward direction, and at the same time, extending an upper boundary and a lower boundary so that they intersect with the moved starting boundary, thereby forming a new forward-expanded region defined by the moved starting boundary, the extended upper boundary, the extended lower boundary and the unchanged end boundary.

At the same time as forward expansion is performed, a new reduced region can also be obtained, i.e. a region obtained by reducing an adjacent previous region preceding the forward-expanded region. Specifically, the reduced region can be defined by an initial boundary of the previous region, an upper boundary and a lower boundary of the previous region defined by data of the initial boundary and a permissible compression error value, and, as an end boundary, data serving as the starting boundary of the forward-expanded region.

In an example embodiment of the present invention, the rules of the SDT algorithm can be used to set multiple parallelogram-shaped regions; thus, although the initial boundary, upper boundary, lower boundary and end boundary of the region are defined in the above description of the forward expansion and reduction according to an example embodiment of the present invention, those skilled in the art will understand that the parallelogram-shaped region and boundaries thereof defined here may have the same meaning defined in the SDT algorithm.

A specific description is given below, taking as an example the example embodiment shown in FIG. 3. When performing forward expansion of the second region A2, the starting boundary can be moved in a parallel fashion from an original intersection with the data y6 to an intersection with the data y5 in a direction (i.e. the negative X axis direction) opposite to the X axis direction in which data is arranged, without changing the end boundary of the second region A2 that intersects with the data y9 (the end point), while the upper boundary and lower boundary are extended to an intersection with the moved starting boundary intersecting with the data y5, thereby obtaining an expanded second region A2, A3. Thus, an overlap region A3 in which the expanded second region A2 and the first region A2 overlap can be obtained, and the data y5 that falls within the overlap region A3 and is furthest from the second region A2 can be used as the starting boundary of the expanded second region, thereby obtaining the expanded second region with the data y5 and the data y9 as boundaries.

In addition, a reduced first region can also be obtained, i.e. without changing the upper boundary and lower boundary of the first region A1 defined by the data y1 of the starting boundary of the first region A1 and the permissible compression error value ΔE1, the data y5 serving as the starting boundary of the expanded second region acts as the end boundary of the reduced first region, and it is thereby possible to obtain the reduced first region with the data y1 and data y5 as the starting boundary and end boundary.

The data processing unit 300 can then calculate a compression error. For example, a compression error CE5_9 of the expanded second region with the data y5 and y9 as boundaries can be calculated according to the rules of the SDT algorithm. At the same time, a compression error CE1_5 of the reduced first region with the data y1 and y5 as boundaries can be calculated according to the rules of the SDT algorithm. The compression error CE5_9 corresponding to the expanded second region and the compression error CE1_5 can then be compared.

Specifically, a compression error CE1 of the first region A1 with the data y1 and y6 as boundaries and a compression error CE2 of the second region A2 with the data y6 and y9 as boundaries can be calculated. A determination can then be made as to whether the compression error CE1_5 is less than or equal to the compression error CE1 of the first region, and whether the compression error CE5_9 is less than or equal to the compression error CE2 of the second region.

When it is determined that the compression error CE1_5 is less than or equal to the compression error CE1 of the first region and the compression error CE5_9 is less than or equal to the compression error CE2 of the second region, this indicates that a compression error obtainable by compressing the data y1, y2, . . . , y9 using the reduced first region and the expanded second region is less than or equal to a compression error obtainable by performing compression using the first region A1 and the second region A2. Thus, according to an example embodiment, the reduced first region with the smaller compression error can be used as a new first region, i.e. the first region can be reset.

Referring to step S205 in FIG. 2, the data processing unit 300 can then compress the data y1, . . . , y5 covered by the reset first region. For example, compression is performed using the rules of the SDT algorithm, i.e. the data y1, y5 can be stored while not storing the data y2, y3 and y4.

Thus, a reset first region with a smaller compression error can be obtained by forward expansion of the second region, and it is thereby possible to reduce or minimize the compression error for data compression.

An example embodiment of resetting the first region has been described above with reference to FIGS. 2 and 3; identical or similar operations could also be performed on the second region adjacent to the first region and on other regions, in order to minimize the compression error.

For example, the data to be compressed may comprise data y1, y2, . . . , yn−1, yn, yn+1, . . . , yn+m, . . . , arranged in sequence in a 2D spatial representation. Here, n and m may be integers greater than 2.

The data processing unit 300 can set the first region so that it has the data y1 and data yn as boundaries and covers the data y1, y2, . . . , yn−1, yn, and can set the second boundary so that it has the data y1 and yn+m as boundaries and covers the data yn, yn+1, . . . , yn+m−1, yn+m.

The second region can be expanded forward in the following manner: the second region is expanded in the 2D spatial representation in a direction opposite to the direction of data arrangement so as to overlap the first region, thereby obtaining an expanded second region that covers data yi, yi+1, . . . , yn−1 covered by the region of overlap and data yn, yn+1, . . . , yn+m−1, yn+m covered by the second region. Here, i may be an integer with 1<i≤n−1.

The data processing unit 300 can then calculate a compression error CE1_$i$ of the data y1, y2, . . . , yi covered by a reduced first region with the data y1 and data yi as boundaries, and a compression error CEi_n+m of the data yi, yi+1, . . . , yn−1, yn, yn+1, . . . , yn+m−1, yn+m covered by the expanded second region with the data yi and data yn+m as boundaries. The data processing unit 300 can then determine whether the compression error CE1_$i$ is less than or equal to the compression error CE1 of the first region, and whether the compression error CEi_n+m is less than or equal to the compression error CE2 of the second region. When it is determined that the compression error CE1_$i$ is less than or equal to the compression error CE1 of the first region and the compression error CEi_n+m is less than or equal to the compression error CE2 of the second region, the reduced first region that has the data y1 and data yi as boundaries and covers the data y1, y2, . . . , yi can be used as the reset first region.

Figure 4:
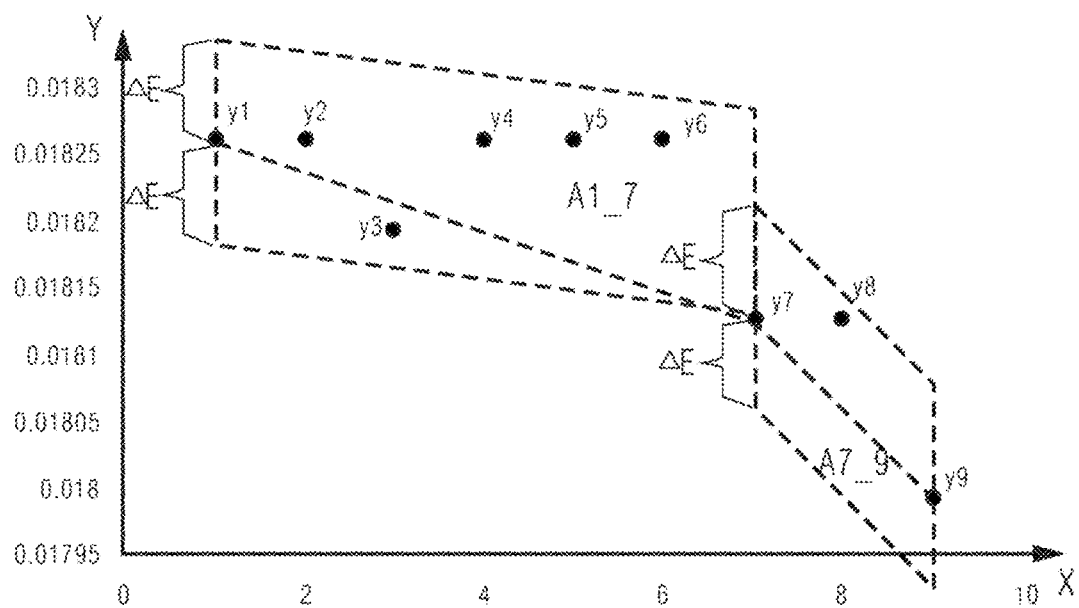
FIG. 4 is a schematic diagram showing set regions according to an example embodiment.
Figure 5:
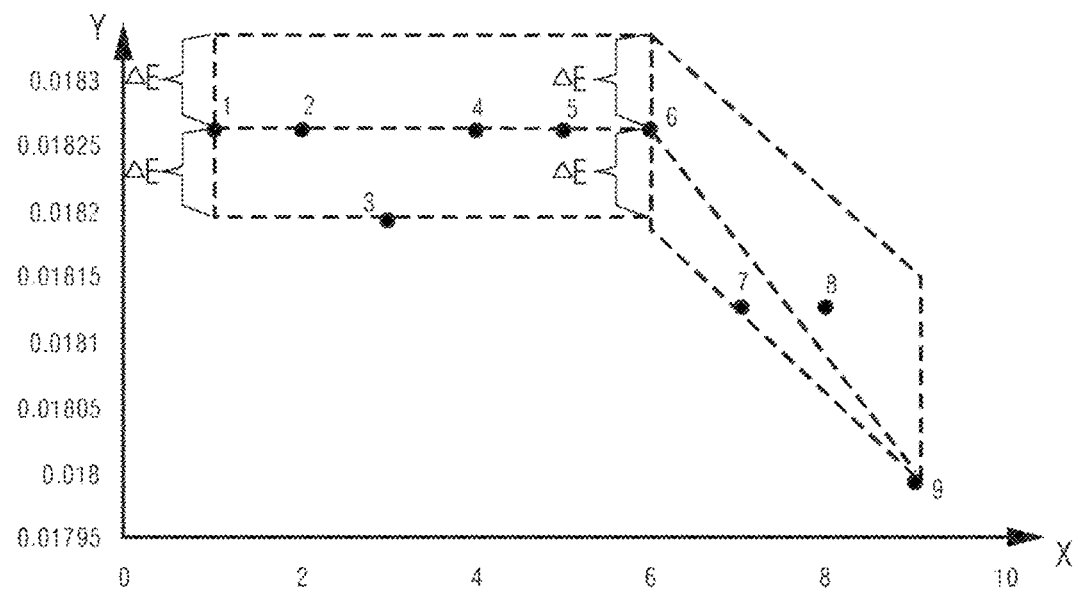
FIG. 5 is a schematic diagram showing the result of resetting a first region in FIG. 4 according to an example embodiment.

However, example embodiments are not limited to this. FIGS. 4 and 5 show schematic diagrams of data compression by another compression method according to an example embodiment. FIG. 4 is a schematic diagram showing set regions; FIG. 5 is a schematic diagram showing the result of resetting a first region in FIG. 4.

FIG. 4 shows a 2D spatial representation of data to be compressed y1, y2, . . . , y9, with dimensions X (e.g. time) and Y (e.g. a value sensed by a sensor). First of all, the data processing unit 300 can use SDT algorithm rules to set a first region A1_7 and a second region A7_9 according to a predetermined permissible compression error value ΔE. The first region A1_7 can have the data y1 and y7 as boundaries and cover the data y1, y2, y3, y4, y5, y6 and y7. The second region A7_9 can have the data y7 and data y9 as boundaries and cover the data y7, y8 and y9.

According to an example embodiment, the data processing unit 300 can expand the second region A7_9 forward, so as to obtain an expanded second region. Although not shown in FIG. 4, the expanded second region may have the data y4 and y9 as boundaries and cover the data y4, y5, y6, y7, y8 and y9. At the same time, a reduced first region can be obtained, which may have the data y1 and y4 as boundaries and cover the data y1, y2, y3 and y4.

The data processing unit 300 can then calculate a compression error CE4_9 of the data covered by the expanded second region and a compression error CE1_4 of the data covered by the reduced first region. A determination can then be made as to whether the compression error CE4_9 of the data covered by the expanded second region is less than or equal to a compression error CE7_9 of the data covered by the second region A7_9, and at the same time a determination can be made as to whether the compression error CE1_4 of the data covered by the reduced first region is less than or equal to a compression error CE1_7 of the data covered by the first region A1_7.

In the example embodiment shown in FIGS. 4 and 5, CE1_4>CE1_7 and CE4_9>CE7_9. At this point, according to an example embodiment, the data processing unit 300 can further calculate a compression error CE1_5 of the data y1, y2, . . . , y5 covered by a reduced first region with the data y1 and data y5 as boundaries, and a compression error CE5_9 of the data y5, . . . , y9 covered by an expanded second region with the data y5 and data y9 as boundaries. It is then possible to whether the compression error CE5_9 is less than or equal to the compression error CE7_9, and at the same time a determination can be made as to whether the compression error CE1_5 is less than or equal to the compression error CE1_7.

In the example embodiment shown in FIGS. 4 and 5, CE1_5>CE1_7 and CE5_9>CE7_9. At this point, according to an example embodiment, the data processing unit 300 can further calculate a compression error CE1_6 of the data y1, y2, . . . , y6 covered by a reduced first region with the data y1 and data y6 as boundaries, and a compression error CE6_9 of the data y6, . . . , y9 covered by an expanded second region with the data y6 and data y9 as boundaries. It is then possible to whether the compression error CE6_9 is less than or equal to the compression error CE7_9, and at the same time a determination can be made as to whether the compression error CE6_5 is less than or equal to the compression error CE1_7.

In the example embodiment shown in FIGS. 4 and 5, CE1_6≤CE1_7 and CE6_9≤CE7_9. At this point, as shown in FIG. 5, the data processing unit 300 can reset the first region to be a reset first region A1_6 that has the data y1 and y6 as boundaries and covers the data y1, . . . , y6. At the same time, the data processing unit 300 can obtain an expanded second region A6_9 that has as a starting boundary the data y6 of the end boundary of the reset first region A1_6.

In other words, when the compression errors of the data covered by the new regions obtained by forward expansion are increased relative to the compression errors of the data covered by the original regions, the starting boundary/end boundary of the new regions can be changed, until it is determined that the compression errors of the data covered by the regions with the changed starting boundary/end boundary are less than or equal to the compression error positions of the data covered by the original regions.

Example embodiments of performing resetting for the first region have been described above with reference to FIGS. 2-5, but it is also possible to perform identical or similar operations for the second region adjacent to the first region, a third region adjacent to the second region . . . , in order to minimize the compression error.

For example, after resetting the first region, the above operations can be repeated for a subsequent region. For example, the multiple regions may comprise an Nth region and an (N−1)th region adjacent to each other and comprise the Nth region and an (N+1)th region. The Nth region and (N−1)th region can be adjacent to each other and cover multiple items of data; the (N+1)th region and Nth region can be adjacent to each other and cover multiple items of data. Here, N is an integer with N≥1. For example, when N is equal to 1, the operations described here will be the same as the operations in the embodiments described above with reference to FIGS. 2-5.

When the (N−1)th region has been reset, the Nth region can be expanded forward to form an expanded Nth region, which has as a starting boundary the data serving as the end boundary of the reset (N−1)th region. In the example shown in FIG. 3, when N is equal to 2, the starting boundary of the expanded Nth region (the second region) can be the data y5. In the example shown in FIGS. 4 and 5, when N is equal to 2, the starting boundary of the expanded Nth region (the second region) can be the data y6.

The (N+1)th region can then be expanded forward in the same way as the Nth region was expanded forward before resetting the (N−1)th region above, to obtain an expanded (N+1)th region that overlaps the expanded Nth region. At this point, a compression error of the data covered by the expanded (N+1)th region is calculated, and the expanded Nth region can be reset according to the calculated compression error. The reset expanded Nth region can then be compressed. The specific details when N is equal to 1 have been described above. Those skilled in the art should understand the operations when N is greater than 1, so a redundant description of repeated content is omitted.

Figure 6:
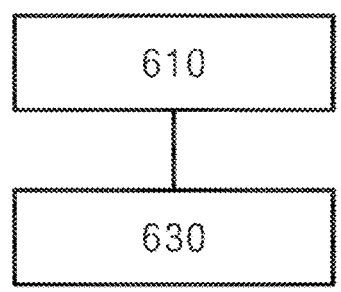
FIG. 6 is a block diagram showing an electronic device according to an example embodiment.

The data processing method according to an example embodiment has been above with reference to FIGS. 2-5; such a method can be realized by hardware, software or a combination of hardware and software. FIG. 6 is a block diagram showing an electronic device according to an example embodiment. In the present example embodiment, the electronic device may comprise at least one processor 610 and a memory 630. The processor 610 can execute at least one computer readable instruction (i.e. the abovementioned element realized in the form of software) encoded or stored in a computer readable storage medium (i.e. the memory 630).

In one embodiment, a computer executable instruction is stored in the memory 630; when executed, the computer executable instruction causes at least one processor 610 to realize or execute the method described above with reference to FIGS. 2-5.

It should be understood that when executed, the computer executable instruction stored in the memory 630 causes at least one processor 610 to perform the various operations and functions above that are described in the various embodiments in conjunction with FIGS. 2-5.

According to one embodiment, a program product such as a non-transitory machine readable medium is provided. The non-transitory machine readable medium may have an instruction (i.e. the abovementioned element realized in the form of software); when executed by a machine, the instruction causes the machine to perform the various operations and functions described above in conjunction with FIGS. 2-5 in the various embodiments of the present application.

According to one embodiment, a computer program product is provided, comprising a computer executable instruction which, when executed, causes at least one processor to perform the various operations and functions described above in conjunction with FIGS. 2-5 in the various embodiments of the present application.

It should be understood that although the description herein is based on various embodiments, it is by no means the case that each embodiment contains only one independent technical solution; this manner of presentation has been adopted herein purely for clarity, so those skilled in the art should consider the specification as a whole, and the technical solutions in the various embodiments can be suitably combined to form other embodiments understandable to those skilled in the art.

The above are merely particular schematic embodiments of the present invention, which are not intended to define the scope thereof. All equivalent changes, amendments and combinations made by any person skilled in the art without departing from the concept and principles of the present invention should be included in the scope of protection thereof.

The invention claimed is:

1. A data processing system, comprising:
a data acquisition unit, configured to acquire multiple items of data relating to a target object; and
a data processing unit, configured to
receive the multiple items of data, and set multiple mutually adjacent regions in a two-dimensional spatial representation of the multiple items of data according to a permissible compression error value, the multiple mutually adjacent regions including a first region adjacent to a second region, the first and second regions separately covering multiple items of data, and
expand the second region forward to
obtain an expanded second region overlapping the first region,
calculate a compression error of data covered by the expanded second region,
reset the first region according to the compression error calculated, and
compress the data covered by the first region after being reset.

2. The data processing system of claim 1, wherein the data processing unit is configured to set multiple regions, calculate a compression error and perform compression according to a rule of a Swing Door Trending (SDT) algorithm.

3. The data processing system of claim 1, wherein the data processing unit is configured to use the data covered by an overlap region, in which the first region and the expanded second region overlap, as an end boundary of the reset first region.

4. The data processing system of claim 1, wherein
the multiple items of data include data y1, y2, . . . , yn−1, yn, yn+1, . . . , yn+m, . . . , arranged in sequence in the two-dimensional spatial representation, wherein n and m are integers greater than 2,
the data processing unit is configured to set the first region to have the data y1 and data yn as boundaries and cover the data y1, y2, . . . , yn−1, yn,
the data processing unit is configured to set the second region to have the data yn and data yn+m as boundaries and cover the data yn, yn+1, . . . , yn+m−1, yn+m,
wherein the data processing unit is configured to expand the second region in the two-dimensional spatial representation in a direction opposite to a direction of data arrangement so as to overlap the first region, and thereby obtain an expanded second region that covers the data yi, yi+1, . . . , yn−1 covered by a region of overlap, wherein i is an integer with 1<i≤n−1, and the data yn, yn+1, . . . , yn+m−1, yn+m covered by the second region.

5. The data processing system of claim 4, wherein the data processing unit is configured to:
calculate a compression error CE1_$i$ of the data y1, y2, . . . , yi covered by a reduced first region with the data y1 and data yi as boundaries, calculate a compression error CEi_n+m of the data yi, yi+1, ..., yn−1, yn, yn+1, ... yn+m−1, yn+m covered by the expanded second region with the data yi and data yn+m as boundaries, determine whether the compression error CE1_$i$ is less than or equal to a compression error CE1 of the first region, and determine whether the compression error CEi_n+m is less than or equal to a compression error CE2 of the second region; and wherein the data processing unit is configured to use, as the reset first region, the reduced first region including the data y1 and data yi as boundaries and covering the data y1, y2, ..., yi, when the compression error CE1_$i$ is determined to be less than or equal to the compression error CE1 of the first region and when the compression error CEi_n+m is determined to be less than or equal to the compression error CE2 of the second region.

6. The data processing system of claim 5, wherein the data processing unit is configured to:

calculate a compression error CE1_$i$+j of the data y1, y2, ..., yi+j covered by the reduced first region with the data y1 and data yi+j as boundaries and calculate a compression error CEi+j_n+m of the data yi+j, ..., yn−1, yn, yn+1, ..., yn+m−1, yn+m covered by the expanded second region with the data yi+j and data yn+m as boundaries, when a compression error CE1_$i$+j−1 is determined to be greater than the compression error CE1 of the first region or when a compression error CEi+j−1_n+m is determined to be greater than the compression error CE2 of the second region, wherein j is an integer with 1≤j<n−i, and wherein the data processing unit is configured to use, as the reset first region, the reduced first region with the data y1 and data yi+j as boundaries, when the compression error CE1_$i$+j is determined to be less than or equal to the compression error CE1 of the first region and when the compression error CEi+j_n+m is determined to be less than or equal to the compression error CE2 of the second region.

7. The data processing system of claim 1, wherein the data processing unit is configured to set the multiple regions to comprise an Nth region and an (N+1)th region, wherein the Nth region and an (N−1)th region are adjacent to each other and cover multiple items of data, and wherein the (N+1)th region and Nth region are adjacent to each other and cover multiple items of data, wherein N is an integer with N>1, wherein the data processing unit is configured to:

expand the Nth region forward, when the (N−1)th region is reset, to form an expanded Nth region having as a starting boundary the data serving as an end boundary of the reset (N−1)th region, expand the (N+1)th region forward to obtain an expanded (N+1)th region overlapping the expanded Nth region, calculate a compression error of the data covered by the expanded (N+1)th region, reset the expanded Nth region according to the compression error calculated to create a reset expanded Nth region, and compress the reset expanded Nth region.

8. A data processing method, further comprising:

setting multiple mutually adjacent regions in a two-dimensional spatial representation of multiple items of data to be compressed, according to a permissible compression error value, the multiple mutually adjacent regions including a first region adjacent to a second region, the first and second regions separately covering multiple items of data;

expanding the second region forward to obtain an expanded second region overlapping the first region;

calculating a compression error of the data covered by the expanded second region;

resetting the first region according to the compression error calculated; and compressing the data covered by the first region after the resetting.

9. The method of claim 8, wherein the setting of the multiple mutually adjacent regions, the calculating of the compression error and the compressing are performed according to a rule of a Swing Door Trending (SDT) algorithm.

10. The method of claim 8, wherein the resetting of the first region comprises:

using the data covered by an overlap region, in which the first region and the expanded second region overlap, as an end boundary of the reset first region.

11. The data processing method of claim 8, wherein the multiple items of data include data y1, y2, ..., yn−1, yn, yn+1, ..., yn+m, ..., arranged in sequence in the two-dimensional spatial representation, wherein n and m are integers greater than 2, the first region includes the data y1 and data yn as boundaries and covers the data y1, y2, ..., yn−1, yn, the second region includes the data yn and data yn+m as boundaries and covers the data yn, yn+1, ..., yn+m−1, yn+m, and wherein the expanding of the second region forward comprises:

expanding the second region in the two-dimensional spatial representation in a direction opposite to a direction of data arrangement so as to overlap the first region, and to obtain an expanded second region that covers the data yi, yi+1, ..., yn−1 covered by a region of overlap, wherein i is an integer with 1<i≤n−1, and the data yn, yn+1, ..., yn+m−1, yn+m covered by the second region.

12. The data processing method of claim 11, wherein the calculating of the compression error of the data covered by the expanded second region comprises:

calculating a compression error CE1_$i$ of the data y1, y2, ..., yi covered by a reduced first region with the data y1 and data yi as boundaries, calculating a compression error CEi_n+m of the data yi, yi+1, ..., yn−1, yn, yn+1, ..., yn+m−1, yn+m covered by the expanded second region with the data yi and data yn+m as boundaries, determining whether the compression error CE1_$i$ is less than or equal to a compression error CE1 of the first region, and determining whether the compression error CEi_n+m is less than or equal to a compression error CE2 of the second region; and wherein the resetting of the first region according to the calculated compression error comprises:

using as the reset first region the reduced first region including the data y1 and data yi as boundaries and covering the data y1, y2, ..., yi, when the compression error CE1_$i$ is determined to be less than or equal to the compression error CE1 of the first region and when the compression error CEi_n+m is determined to be less than or equal to the compression error CE2 of the second region.

13. The data processing method of claim 12, wherein
the calculating of the compression error corresponding to the expanded second region comprises:
calculating a compression error $CE1\_i+j$ of the data y1, y2, ..., yi+j covered by the reduced first region with the data y1 and data yi+j as boundaries and calculating a compression error $CEi+j\_n+m$ of the data yi+j, ..., yn−1, yn, yn+1, ..., yn+m−1, yn+m covered by the expanded second region with the data yi+j and data yn+m as boundaries, when a compression error $CE1\_i+j−1$ is determined to be greater than the compression error CE1 of the first region or when a compression error $CEi+j−1\_n+m$ is determined to be greater than the compression error CE2 of the second region, wherein j is an integer with $1 \leq j < n-i$,
wherein the resetting of the first region according to the calculated compression error comprises:
using as the reset first region the reduced first region with the data y1 and data yi+j as boundaries, when the compression error $CE1\_i+j$ is determined to be less than or equal to the compression error CE1 of the first region and when the compression error $CEi+j\_n+m$ is determined to be less than or equal to the compression error CE2 of the second region.

14. The data processing method of claim 8, wherein the multiple regions include an Nth region and an (N+1)th region, wherein the Nth region and an (N−1)th region are adjacent and cover multiple items of data, wherein the (N+1)th region and Nth region are adjacent and cover multiple items of data, and wherein N is an integer with N>1,
the data processing method further comprising:
expanding the Nth region forward when the (N−1)th region is reset, to form an expanded Nth region including as a starting boundary the data serving as an end boundary of the reset (N−1)th region;
expanding the (N+1)th region forward to obtain an expanded (N+1)th region overlapping the expanded Nth region;
calculating a compression error of the data covered by the expanded (N+1)th region;
resetting the expanded Nth region according to the compression error calculated to form a reset expanded Nth region; and
compressing the reset expanded Nth region.

15. An electronic device, comprising:
at least one processor; and
a memory connected to the at least one processor, the memory storing an instruction, wherein the instruction, when executed by the at least one processor, causes the electronic device to perform at least:
setting multiple mutually adjacent regions in a two-dimensional spatial representation of multiple items of data to be compressed, according to a permissible compression error value, the multiple mutually adjacent regions including a first region adjacent to a second region, the first and second regions separately covering multiple items of data;
expanding the second region forward to obtain an expanded second region overlapping the first region;
calculating a compression error of the data covered by the expanded second region;
resetting the first region according to the compression error calculated; and
compressing the data covered by the first region after the resetting.

16. A non-transitory machine readable medium, storing a computer executable instruction on the non-transitory machine readable medium, wherein the computer executable instruction, when executed by at least one processor, causes at least one processor to perform the method of claim 8.

17. A computer program product, storing a computer executable instruction which, when executed by at least one processor, causes at least one processor to perform the method of claim 8.

18. The data processing system of claim 2, wherein the data processing unit is configured to use the data covered by an overlap region, in which the first region and the expanded second region overlap, as an end boundary of the reset first region.

19. The data processing system of claim 2, wherein
the multiple items of data include data y1, y2, ..., yn−1, yn, yn+1, ..., yn+m, ..., arranged in sequence in the two-dimensional spatial representation, wherein n and m are integers greater than 2,
the data processing unit is configured to set the first region to have the data y1 and data yn as boundaries and cover the data y1, y2, ..., yn−1, yn,
the data processing unit is configured to set the second region to have the data yn and data yn+m as boundaries and cover the data yn, yn+1, ..., yn+m−1, yn+m,
wherein the data processing unit is configured to expand the second region in the two-dimensional spatial representation in a direction opposite to a direction of data arrangement so as to overlap the first region, and thereby obtain an expanded second region that covers the data yi, yi+1, ..., yn−1 covered by a region of overlap, wherein i is an integer with $1 < i \leq n-1$, and the data yn, yn+1, ..., yn+m−1, yn+m covered by the second region.

20. The data processing system of claim 19, wherein the data processing unit is configured to:
calculate a compression error $CE1\_i$ of the data y1, y2, ..., yi covered by a reduced first region with the data y1 and data yi as boundaries,
calculate a compression error $CEi\_n+m$ of the data yi, yi+1, ..., yn−1, yn, yn+1, ... yn+m−1, yn+m covered by the expanded second region with the data yi and data yn+m as boundaries,
determine whether the compression error $CE1\_i$ is less than or equal to a compression error CE1 of the first region, and
determine whether the compression error $CEi\_n+m$ is less than or equal to a compression error CE2 of the second region; and
wherein the data processing unit is configured to use, as the reset first region, the reduced first region including the data y1 and data yi as boundaries and covering the data y1, y2, ..., yi, when the compression error $CE1\_i$ is determined to be less than or equal to the compression error CE1 of the first region and when the compression error $CEi\_n+m$ is determined to be less than or equal to the compression error CE2 of the second region.

21. The data processing method of claim 9, wherein the resetting of the first region comprises:
using the data covered by an overlap region, in which the first region and the expanded second region overlap, as an end boundary of the reset first region.

22. The data processing method of claim 9, wherein
the multiple items of data include data y1, y2, ..., yn−1, yn, yn+1, ..., yn+m, ..., arranged in sequence in the two-dimensional spatial representation, wherein n and m are integers greater than 2, the first region includes the data $y_1$ and data $y_n$ as boundaries and covers the data $y_1, y_2, \ldots, y_{n-1}, y_n$, the second region includes the data $y_n$ and data $y_{n+m}$ as boundaries and covers the data $y_n, y_{n+1}, \ldots, y_{n+m-1}, y_{n+m}$, and wherein the expanding of the second region forward comprises:
   expanding the second region in the two-dimensional spatial representation in a direction opposite to a direction of data arrangement so as to overlap the first region, and to obtain an expanded second region that covers the data $y_i, y_{i+1}, \ldots, y_{n-1}$ covered by a region of overlap, wherein i is an integer with $1 < i \leq n-1$, and the data $y_n, y_{n+1}, \ldots, y_{n+m-1}, y_{n+m}$ covered by the second region.

* * * * *